United States Patent
Buchanan et al.

(10) Patent No.: US 9,721,661 B1
(45) Date of Patent: Aug. 1, 2017

(54) CONTENT ADDRESSABLE MEMORIES

(71) Applicant: HEWLETT PACKARD ENTERPRISE DEVELOPMENT LP, Houston, TX (US)

(72) Inventors: Brent Buchanan, Palo Alto, CA (US); Le Zheng, Palo Alto, CA (US); John Paul Strachan, Palo Alto, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 15/216,011

(22) Filed: Jul. 21, 2016

(51) Int. Cl.
G11C 15/04 (2006.01)

(52) U.S. Cl.
CPC ........... G11C 15/046 (2013.01); G11C 15/04 (2013.01)

(58) Field of Classification Search
CPC ... G11C 15/00; G11C 15/046; G11C 13/0004; G11C 2213/79; G11C 13/0002; G11C 13/0023; G06F 12/0802; G06F 12/0871
See application file for complete search history.

(56) References Cited

U.S. PATENT DOCUMENTS

| 6,606,263 B1 | 8/2003 | Tang |
| 8,179,739 B2 | 5/2012 | Hanzawa et al. |
| 9,087,572 B2 * | 7/2015 | Sekar ............... G11C 15/00 |
| 9,431,106 B1 * | 8/2016 | Roy ................. G11C 15/046 |
| 2014/0355330 A1 | 12/2014 | Endoh et al. |
| 2016/0203868 A1 * | 7/2016 | Wang ............... G11C 15/046 365/49.17 |

FOREIGN PATENT DOCUMENTS

WO    WO-2015/085093 A1    6/2015

OTHER PUBLICATIONS

Pilin Junsangsri and Fabrizio Lombardi, "A Memristor-Based TCAM (Ternary Content Addressable Memory) Cell: Design and Evaluation," GLSVLSI'12, May 3-4, 2012, Salt Lake City, Utah, USA, pp. 311-314, ACM.
Qing Guo et al., "AC-DIMM: Associative Computing with STT-MRAM," ISCA'13, Tel-Aviv, Israel, Jun. 2013, pp. 189-200, ACM.

* cited by examiner

Primary Examiner — Harry W Byrne
Assistant Examiner — Ajay Ojha
(74) Attorney, Agent, or Firm — Hewlett Packard Enterprise Patent Department

(57) ABSTRACT

An example content addressable memory. A bit cell of the memory may include a memristor and a switching transistor that are connected in series between a first data line and a second data line. The bit cell may also include a match-line transistor connected between a match line and a rail. A gate of the match-line transistor may be connected to a common node of the memristor and the switching transistor. The switching transistor may be sized such that its channel resistance when on is between a resistance associated with a low-resistance state of the memristor and a resistance associated with a high-resistance state of the memristor.

18 Claims, 6 Drawing Sheets

Fig. 2

| Stored Value | Resistance of M |
|---|---|
| 0 | High |
| 1 | Low |

Fig. 3

| Search Criteria | Stored Value | Result |
|---|---|---|
| 0 | 0 | Match |
| 0 | 1 | Miss |
| 1 | 0 | Miss |
| 1 | 1 | Match |
| Y (wildcard) | Any | Match |

Fig. 4

| Operation | WL | DL1 | DL2 | RL | ML |
|---|---|---|---|---|---|
| M → LRS | $V_{DD}$ | $V_{set}$ | GND | $V_{set}$ | $V_{set}$ |
| M → HRS | $V_{DD}$ | GND | $V_{reset}$ | $V_{reset}$ | $V_{reset}$ |
| Read | $V_{DD}$ | $V_{read}$ | GND | GND | measure current |
| Read | $V_{DD}$ | GND | $V_{read}$ | GND | measure current |

CONTENT ADDRESSABLE MEMORIES

BACKGROUND

Content addressable memory (CAM) is a type of memory that can perform a search operation in which a data string may be input as search content and the resulting output is an address of a location in the memory that stores matching data (if there is any). This is in contrast to a read operation in which an address is input and the resulting output is the data stored in the memory location corresponding to the searched address. Certain CAMs may be able to perform both the aforementioned search operation and the aforementioned read operation, while non-CAM memories may be able to perform the read operation but not the search operation.

BRIEF DESCRIPTION OF THE DRAWINGS

FIG. 2 is a table illustrating an association between resistance states and stored values.

FIG. 3 is a table illustrating search results for combinations of search criteria and stored value.

FIG. 4 is a table illustrating voltages that are applied to wiring lines of an example CAM to perform writing and reading operations.

DETAILED DESCRIPTION

Figure 1A:
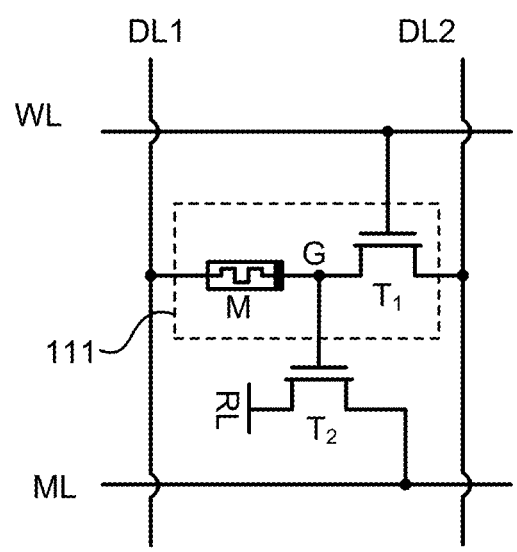
FIG. 1A is circuit diagram illustrating an example bit cell of an example CAM.

Described herein are example CAMs that include memristors as storage elements. Also described herein are example devices that may have a CAM as a component thereof, as well as example methods of operating CAMs.
[Examples CAMs—Overview]

The example CAMs described herein may include memristors as storage elements. The use of memristors as storage elements, as opposed to using, for example, SRAMs or DRAMs, allows the example CAMs disclosed herein to be non-volatile memory devices. In addition, as a result of using memristor-based storage elements, the example CAMs disclosed herein may have higher storage densities and lower power consumption than comparable CAMs that use SRAMs or DRAMs as storage elements.

Moreover, certain of the example CAMs disclosed herein may be capable of being searched on the basis of three search criteria (e.g., 0, 1, and a wildcard), which may provide increased flexibility and speed in search operations as compared to a CAM that is searchable on the basis of two search criteria (e.g., 0 and 1).

Furthermore, the example CAMs disclosed herein may have bit cell circuit layouts that can fit in a smaller layout space than other CAM bit cell layouts, which may allow the example CAMs to have a more densely packed memory array (i.e., more bit cells per unit area) than other comparable CAMs. In certain examples, such savings of bit cell layout space might be achieved, for example, as a result of the bit cell circuit layout allowing for the use of just two FETs per bit cell instead of the three or more FETs per bit cell that may be required in other circuit layouts in order to provide CAM functionality. As another example of how such savings of bit cell layout space might be achieved, in certain of the example CAMs disclosed herein all of the transistors in the bit cells of the CAM may be a same channel type as one another (for example, all NFETs); this may allow for a well to be omitted from the bit cell array that might otherwise be needed, thus freeing up layout space that would have been used for the well. In addition to saving layout space, the use of transistors having all the same channel type may also decrease the complexity and/or cost of manufacturing the CAM.

In particular, in certain example CAMs disclosed herein, a bit cell may include a memristor, a switching transistor, and a match-line transistor. The memristor and the switching transistor may be connected in series between a first data line and a second data line. The match-line transistor may be connected between a match-line and a rail. A gate of the match-line transistor may be connected to a common node of the memristor and the switching transistor. The switching transistor may be sized such that its channel resistance when on (i.e., when ohmic) is between a resistance associated with a low-resistance state of the memristor and a resistance associated with a high-resistance state of the memristor. A gate of the switching transistor may be connected to a word line.

Furthermore, certain of the example CAMs may also include control circuitry that searches the bit cell based on a first search criterion (e.g., 0), based on a second search criterion (e.g., 1), and based on a wildcard search criterion. If the bit cell stores a value that does not match the search criterion, the voltage of the common node during the search may become a voltage that turns on the match-line transistor, thereby connecting the match line to the rail and resulting in a voltage of the match line (which has been pre-charged) being pulled down below its pre-charged voltage. If the bit cell stores a value matching the search criterion, then the voltage of the common node may become a voltage that keeps the match-line transistor off so that the voltage of the match-line is not pulled down (at least not by that bit cell—it might be pulled down by some other bit cell). Thus, matches or misses of the search criterion may be determined by monitoring the match line and determining whether or not its voltage is pulled low.

The control circuit may search the bit cell based on the first search criterion by pre-charging the match line, applying a first voltage to the first data line, applying a ground voltage to the second data line, and applying a third voltage to the rail. The control circuit may search the bit cell based on a second search criterion by pre-charging the match line, applying the ground voltage to the first data line, applying the first voltage to the second data line, and applying a fourth voltage to the rail. The control circuit may search the bit cell based on the wildcard search criterion by applying a ground voltage to both the first and second data lines.

The memristor and the switching transistor of the bit cell may form a resistive divider. An output voltage of the resistive divider (i.e., the voltage of the common node between the memristor and the switching transistor) is applied to the gate of the match-line transistor, and thus the output voltage of the resistive divider may control whether the match-line transistor is on or off. The relative resistances of the memristor and the switching transistor and the voltages that are applied to the bit cell during a search operation may be set such that the output voltage of the resistive divider during the search operation is an off-voltage (low voltage) when the memristor stores a value that matches the search criterion and an on-voltage (high voltage) when the memristor stores a value that matches the search criterion. When the search criterion is the wildcard search criterion, the output voltage of the resistive divider is low regardless of what value is stored in the resistive divider.

Certain example CAMs may include multiple instances of the example bit cells described above, which may be arrayed in rows and columns. In certain examples, each first and second data line may be connected to each bit cell in a same column, and each word line may be connected to each bit cell in a same row. Each match line may be connected to multiple bit cells that are in a same row as one another, with the number of bit cells per match line being equal to a search unit size for the CAM (i.e., a word size) and the bit cells that are connected to the same match line as one another forming a word storage block. The bit cells of the word storage block may be searched to see if the data stored in the word bit cells of the word storage block matches an input search word. The match line for a given word storage block may be pulled low if any one of the bit cells thereof misses its respective search criterion, and therefore it can be determined whether the given word storage block stores data that matches the search word by monitoring whether the corresponding match line is pulled low. Each row may include a single word storage block (in which case there may be one word line per row), or each row may include P>1 word storage blocks (in which case there may be P match lines per row).

[Bit Cells—Detailed Examples]

FIG. 1A illustrates an example bit cell 110 of an example CAM. The example bit cell 110 may include a memristor M, a transistor $T_1$, and a match-line transistor $T_2$. The memristor M may be connected between a first data line DL1 and a node G. The transistor $T_1$ may be connected between the node G and a second data line DL2. Thus, the memristor M and the transistor $T_1$ may be connected via a common node, namely the node G. The match-line transistor $T_2$ may be connected between a rail RL and a match line ML. A gate of the match-line transistor $T_2$ may be connected to the node G, and therefore a voltage of the node G may control a conductive state of the match-line transistor $T_2$. A gate of the transistor $T_1$ may be connected to a word line WL, and therefore a voltage of the word line WL may control a conductive state of the transistor $T_1$.

The memristor M may serve as the storage element of the bit cell 110. The memristor M may be a device whose resistance can be changed between multiple resistance states by applying certain voltage differences across the memristor M or flowing certain currents through the memristor M, with the memristor M "remembering" or maintaining its most recent resistance state even when the voltage/current that caused it to enter that state has been removed. In other words, the current resistance state of the memristor M may depend on the magnitude and polarity of voltage differences that have been applied across the memristor in the past or on how much current has flowed in what direction through the memristor M in the past.

For example, the memristor M may be capable of changing between a low resistance state in which the memristor M exhibits relatively low resistance and a high resistance state in which the memristor M exhibits relatively high resistance. The memristor M may be caused to change to the low resistance state by applying a setting voltage difference of sufficient magnitude with a first polarity across the memristor, and the memristor M may be caused to change to the high resistance state by applying a resetting voltage difference of sufficient magnitude across the memristor M with a second polarity.

Once the memristor M is set or reset, it will tend to stay in its current resistance state until it is reset or set again. As a result, the resistance state of the memristor M may be used to store data values. For example, a high resistance state of the memristor M may represent a first data value and a low resistance state of the memristor M may represent a second data value. Herein, it is assumed that a high resistance state represents a digital 0 and a low resistance state represents a digital 1, as illustrated in the table of FIG. 2; however, it should be understood that the logical association between resistance state and stored value may be arbitrarily selected.

The memristor M may be set to a low resistance state by turning on the switching transistor $T_1$ (e.g., apply $V_{DD}$ to the word line WL), applying the setting voltage $V_{set}$ to the first data line DL1, and applying a ground voltage GND to the second data line DL2, as illustrated in FIG. 4. The memristor M may be reset to a high resistance state by turning on the switching transistor $T_1$ (e.g., apply $V_{DD}$ to the word line WL), applying the resetting voltage $V_{reset}$ to the second data line DL2, and applying the ground voltage GND to the first data line DL1, as illustrated in FIG. 4. The magnitudes of $V_{set}$ and $V_{reset}$ may be set to any values that are larger than minimum values required to be able to set and reset the memristor M, respectively. In particular, if $V_{set\_min}$ is the minimum voltage that will result in setting the memristor M and $V_{reset\_min}$ is the minimum voltage that will result in resetting the memristor M, then $V_{set}$ may be equal to or greater than $V_{set\_min}$ and $V_{reset}$ may be equal to or greater than $V_{reset\_min}$. $V_{set}$ and $V_{reset}$ do not necessarily need to have the same magnitude, since $V_{set\_min}$ is not necessarily the same as $V_{reset\_min}$. However, $V_{set}$ and $V_{reset}$ could be set to the same value as long as that value is greater than or equal to both $V_{set\_min}$ and $V_{reset\_min}$. In certain examples, $V_{DD}=V_{set}=V_{reset}$, where $V_{DD}$ is a highest voltage level of the TCAM. The values of $V_{set\_min}$ and $V_{reset\_min}$ may be parameters of the memristor M that are known in advance, that are determined theoretically based on a model of the memristor M, or that are determined experimentally.

The value that is stored in the bit cell 110 may be read by applying a read voltage difference across the memristor M and measuring a current that flows through the memristor M. The magnitude of the current that flows through the memristor M may be used to determine the resistance state of the memristor M because a high resistance state will result in low current, while a low resistance state will result in high current. In particular, the value stored in the bit cell may be read by turning on the switching transistor $T_1$ (e.g., apply $V_{DD}$ to the word line WL), applying the read voltage $V_{read}$ to either one of the first and second data lines DL1/DL2, and applying the ground voltage GND to the other one of the first and second data lines DL1/DL2, as illustrated in FIG. 4. The current that flows through the memristor M may be sensed on either one of the data lines DL1/DL2, or the current flowing on the match line ML may be sensed. In general, applying voltage differences across the memristor M whose magnitudes are relatively small in comparison to the setting/resetting voltage differences will not significantly affect the resistance state of the memristor M. Thus, in order to ensure that reading the value stored in the bit cell 110 does not change a resistance state of the memristor M, the read voltage difference may be set to a value that is below a minimum voltage that will set or reset the memristor M.

Instead of measuring the current via first and second data lines DL1/DL2 to determine a resistance state of the memristor M, the resistance state of the memristor M may be determined by measuring a voltage of the match line ML during a reading operation. The match-line transistor $T_2$ may be set to act as an amplifier (e.g., common source amplifier or source-follower amplifier), and the voltage of the match line ML may vary depending on the voltage of the node G. Since the voltage of the node G during a reading operation depends on the resistance state of the memristor, the voltage of the match line ML will also depend on the resistance state of the memristor.

Figure 1B:
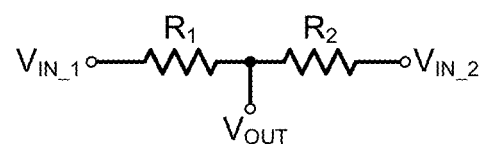
FIG. 1B is a circuit diagram illustrating an example resistive divider.

The bit cell 110 may be thought of as including a resistive divider 111, with the memristor M and the switching transistor $T_1$ serving as the resistors of the resistive divider 111. In general, a resistive divider is formed when two resistors are connected in series, input voltages are applied to opposite input terminals of the resistors, and an output voltage is taken from a common node between the resistors. In particular, FIG. 1B illustrates a generalized form of a resistive divider, with resistors $R_1$ and $R_2$ being connected in series, input voltages $V_{IN\_1}$ and $V_{IN\_2}$ being applied to the input terminals, and the output voltage $V_{OUT}$ being taken from the common node between the resistors $R_1$ and $R_2$ (which may be referred to as the output terminal). Using the labels from FIG. 1B, the output voltage of a generalized resistive divider may be given by the following:

$$V_{OUT} = \frac{R_2 V_{IN\_1} + R_1 R_{IN\_2}}{R_1 + R_2} \quad \text{(eq. 1)}$$

The memristor M and the switching transistor $T_1$ may be considered as being the resistors of the resistor divider 111, and correspond, respectively, to the resistors $R_1$ and $R_2$ of the generalized resistive divider. In a certain sense, a memristor is not the same type of circuit component as a resistor, as the memristor can have its resistance changed over time while a resistor generally has a constant resistance. However, during periods of time in which voltage differences that are less than the setting or resetting voltage differences are applied across a memristor, the memristor has an approximately constant resistance, and thus the memristor M may be modeled approximately during these periods as a resistor. The switching transistor $T_1$ may be sized such that it has a non-negligible channel resistance when the transistor $T_1$ is on (i.e., when it is ohmic), and this channel resistance may be modeled as a resistor.

In particular, the switching transistor $T_1$ may be sized such that its channel resistance when on ($R_{T1}$) is greater than a resistance associated with a low resistance state of the memristor M ($R_{LRS}$), but less than a resistance associated with a high resistance state of the memristor M ($R_{HRS}$)—that is, $R_{LRS} < R_{T1} < R_{HRS}$. The particular value that is set for the channel resistance $R_{T1}$ may be determined based on considerations described in greater detail below with regard to searching operations.

In the resistive divider 111, the two input terminals thereof are formed from the terminal of the memristor M that is connected to the first data line DL1 and the terminal of the transistor $T_1$ that is connected to the second data line DL2. Thus, the input voltages of the resistive divider 111 are the voltage carried by the first data line DL1 ($V_{DL1}$) and the voltage carried by the second data line DL2 ($V_{DL2}$). The input voltages $V_{DL1}$ and $V_{DL2}$ of the resistive divider 111 correspond, respectively, to the input voltage $V_{IN\_1}$ and $V_{IN\_2}$ of the generalized resistive divider. The output terminal of the resistive divider 111 is the node G, and the output voltage of the resistive divider 111 is the voltage of the node G ($V_G$), which corresponds to the output voltage $V_{OUT}$ of the generalized resistive divider. Thus, the voltage of the node G when the transistor $T_1$ has been turned on may be given by the following (obtained from substituting corresponding variables into equation 1):

$$V_G = \frac{R_{T1} V_{DL1} + R_M R_{DL2}}{R_M + R_{T1}} \quad \text{(eq. 2)}$$

where $R_M$ is the present resistance of the memristor M.

The example bit cell 110 may be searched based on three search criteria—namely 0, 1, and a wildcard (denoted Y herein for convenience). The configuration of the bit cell 110 and the voltages that are applied to the bit cell during a search operation are set such that search operations produce the search results illustrated by the table in FIG. 3. In particular, when the bit cell 110 is searched based on the 0 search criterion, the result is a match if the bit cell 110 stores a 0 (i.e., if $R_M \approx R_{HRS}$) and a miss if the bit cell 110 stores a 1 (i.e., if $R_M \approx R_{LRS}$). When the bit cell 110 is searched based on the 1 search criterion, the result is a miss if the bit cell 110 stores a 0 (i.e., if $R_M \approx R_{HRS}$) and a match if the bit cell 110 stores a 1 (i.e., if $R_M \approx R_{LRS}$). When the bit cell 110 is searched based on the wildcard search criterion (Y), the result is a match regardless of what value is stored by the bit cell 110.

Figures 5A, 5B:
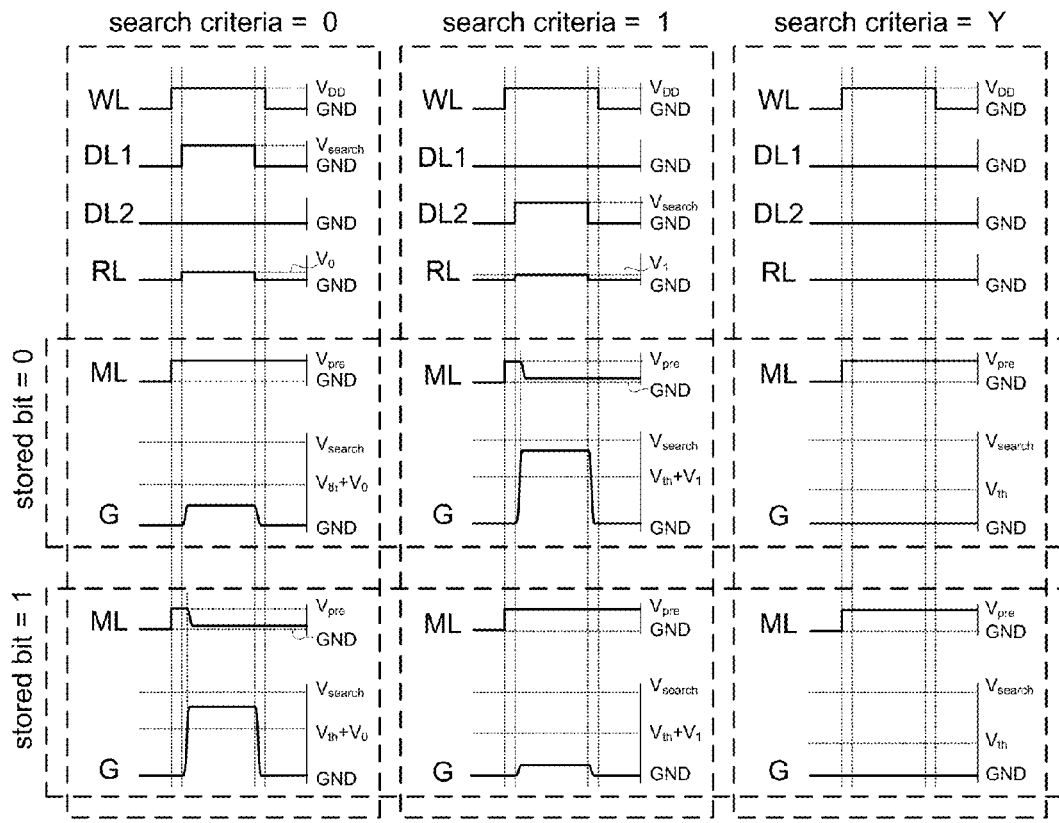
FIG. 5A is a table illustrating voltages that are applied to wiring lines of an example CAM to perform search operations.
FIG. 5B is a signal diagram illustrating voltages that are applied to wiring lines of an example CAM to perform search operations, as well as the states of an example bit cell resulting from such search operations for each combination of search criterion and stored value.

FIGS. 5A and 5B illustrate how search operations based on the above-noted search criteria may be performed, as well as states of the bit cell in response to such search operations for each combination of search criteria and stored value.

To search the bit cell 110 based on the 0 search criterion, the match line ML may be pre-charged to a pre-charge voltage $V_{pre}$, the first transistor $T_1$ may be turned on by applying $V_{DD}$ to the word line WL, a search voltage $V_{search}$ may be applied to the first data line DL1 while the ground voltage GND is applied to the second data line DL2, and a voltage $V_0$ may be applied to the rail RL, as illustrated in FIGS. 5A and 5B. During this search, the input voltages of the resistive divider 111 are $V_{DL1} = V_{search}$ and $V_{DL2} = $GND. Thus, from equation 2 the voltage of the node G during a search based on the 0 search criterion (denoted by $V_G|^{S=0}$) becomes:

$$V_G|^{S=0} = \frac{R_{T1}}{R_M + R_{T1}} V_{search} \quad \text{(eq. 3)}$$

To search the bit cell 110 based on the 1 search criterion, the match line ML may be pre-charged to a pre-charge voltage $V_{pre}$, the first transistor T1 may be turned on by applying $V_{DD}$ to the word line WL, the ground voltage GND may be applied to the first data line DL1 while the search voltage $V_{search}$ is applied to the second data line DL2, and a voltage $V_1$ may be applied to the rail RL. During this search, the input voltages of the resistive divider 111 are $V_{DL1}$=GND and $V_{DL2}=V_{search}$. Thus, from equation 2 the voltage of the node G during a search based on the 1 search criterion (denoted by $V_G|^{S=0}$) becomes:

$$V_G|^{S=1} = \frac{R_M}{R_M + R_{T1}} V_{search} \quad \text{(eq. 4)}$$

The voltage of the node G may control a conductive state of the match-line transistor $T_2$—in particular, the match-line transistor $T_2$ may be turned on when a gate-source voltage thereof is greater than a threshold voltage thereof ($V_{th}$), and may be kept off when a gate-source voltage thereof is less than $V_{th}$. As can be seen from equations 3 and 4, the voltage of the node G during a search operation will depend on the resistance state of the memristor M. Thus, the conductive state of the match-line transistor $T_2$ during a search operation may be controlled based on the resistance state of the memristor M. In particular, by appropriately setting the various resistances of the bit cell 110 and the voltages applied thereto during the search operation, it can be assured that the search results illustrated in FIG. 3 are obtained.

In particular, if the search criterion is 0 and the bit cell 110 stores a 0, then, using equation 3 and $R_M \approx R_{HRS}$, the voltage of the node G in this state (denoted by $$V_G|_{D=0}^{S=0})$$

will become:

$$V_G|_{D=0}^{S=0} \approx \frac{R_{T1}}{R_{HRS} + R_{T1}} V_{search} \quad \text{(eq. 5)}$$

This state is illustrated in FIG. 5B in the column labeled "search criterion=0" and the row labeled "stored bit=0". As illustrated in FIG. 5B, $$V_G|_{D=0}^{S=0}$$

corresponds to a relatively low voltage, since $R_{T1} < R_{HRS}$. In particular, $$V_G|_{D=0}^{S=0} < \frac{1}{2} V_{search}.$$

Thus, if $V_0$ is appropriately set, the gate-source voltage of the match-line transistor $T_2$ may be kept below the threshold voltage $V_{th}$, and therefore the match-line transistor $T_2$ may be kept off. As a result, the bit cell 110 does not pull the voltage of the match line ML down, thereby indicating a match.

If the search criterion is 0 and the bit cell 110 stores a 1, then, using equation 3 and $R_M \approx R_{LRS}$, the voltage of the node G in this state (denoted by $$V_G|_{D=1}^{S=0})$$

will become:

$$V_G|_{D=0}^{S=0} \approx \frac{R_{T1}}{R_{LRS} + R_{T1}} V_{search} \quad \text{(eq. 6)}$$

This state is illustrated in FIG. 5B in the column labeled "search criterion=0" and the row labeled "stored bit=1". As illustrated in FIG. 5B, $$V_G|_{D=1}^{S=0}$$

corresponds to a relatively high voltage, since $R_{LRS} < R_{T1}$. In particular, $$\frac{1}{2} V_{search} < V_G|_{D=1}^{S=0}.$$

Thus, if $V_0$ is appropriately set, the gate-source voltage of the match-line transistor $T_2$ in this state may be raised above the threshold voltage $V_{th}$, and the match-line transistor $T_2$ may be turned on. As a result, the match line ML is connected to the rail RL and begins to discharge, thus pulling the voltage of the match line ML low (thereby indicating a miss).

If the search criterion is 1 and the bit cell 110 stores a 0, then, using equation 4 and $R_M \approx R_{HRS}$, the voltage of the node G in this state (denoted by $$V_G|_{D=0}^{S=1})$$

becomes:

$$V_G|_{D=0}^{S=1} \approx \frac{R_{HRS}}{R_{HRS} + R_{T1}} V_{search} \quad \text{(eq. 7)}$$

This state is illustrated in FIG. 5B in the column labeled "search criterion=1" and the row labeled "stored bit=0". As illustrated in FIG. 5B, $$V_G|_{D=0}^{S=1}$$

corresponds to a relatively high voltage, since $R_{T1} < R_{HRS}$. In particular, $$\frac{1}{2} V_{search} < V_G|_{D=0}^{S=1}.$$

Thus, if $V_1$ is appropriately set, the gate-source voltage of the match-line transistor $T_2$ in this state may be raised above the threshold voltage $V_{th}$, and the match-line transistor $T_2$ may be turned on. As a result, the match line ML is connected to the rail RL and begins to discharge, thus pulling the voltage of the match line ML low (thereby indicating a miss).

If the search criterion is 1 and the bit cell 110 stores a 1, then, using equation 4 and $R_M \approx R_{LRS}$, the voltage of the node G in this state (denoted by $$V_G|_{D=1}^{S=1})$$

becomes:

$$V_G|_{D=1}^{S=1} \approx \frac{R_{LRS}}{R_{LRS} + R_{T1}} V_{search} \quad \text{(eq. 8)}$$

This state is illustrated in FIG. 5B in the column labeled "search criterion=1" and the row labeled "stored bit=1". As illustrated in FIG. 5B $$V_G\vert_{D=1}^{S=1}$$

corresponds to a relatively low voltage, since $R_{HRS} < R_{T1}$. In particular, $$V_G\vert_{D=1}^{S=1} < \frac{1}{2}V_{search}.$$

Thus, if $V_0$ is appropriately set, the gate-source voltage of the match-line transistor $T_2$ may be kept below the threshold voltage $V_{th}$, and therefore the match-line transistor $T_2$ may be kept off. As a result, the bit cell 110 does not pull the voltage of the match line ML down, thereby indicating a match.

In order to ensure that misses result in the match-line transistor $T_2$ being turned on and matches result in the match-line transistor $T_2$ being kept off, then the voltages $V_0$, $V_1$, and $V_{search}$, the resistances $R_{T1}$, $R_{HRS}$, $R_{LRS}$, and the threshold voltage $V_{th}$ may be set such that:

$$\frac{R_{T1}}{R_{HRS}+R_{T1}}V_{search}-V_{th} < V_0 < \frac{R_{T1}}{R_{LRS}+R_{T1}}V_{search}-V_{th}; \text{ and} \quad \text{(eq. 9)}$$

$$\frac{R_{LRS}}{R_{LRS}+R_{T1}}V_{search}-V_{th} < V_1 < \frac{R_{HRS}}{R_{HRS}+R_{T1}}V_{search}-V_{th}$$

In certain examples, the resistances $R_{T1}$, $R_{HRS}$, $R_{LRS}$ and/or the threshold voltage $V_{th}$ may be set based on other considerations, in which case the conditions of equation 9 may be satisfied by setting $V_0$, $V_1$, and $V_{search}$. In certain examples, $V_0 = V_1 = \frac{1}{2} V_{search} - V_{th}$.

In certain examples, it may be desirable for $V_{search}$ to be less than $V_{set\_min}$ and less than $V_{reset\_min}$, so that the search operation does not inadvertently set or reset the memristor M. For example, $V_{search}$ may be the same value as $V_{read}$, since $V_{read}$ is less than $V_{set\_min}$ and $V_{reset\_min}$. Using the same voltage for $V_{read}$ and $V_{search}$ may reduce the complexity of drivers that are used to supply the voltages to the bit cell 110, as fewer distinct voltages may need to be generated.

To search the bit cell 110 based on the wildcard (Y) search criterion, the match line ML may be pre-charged to a pre-charge voltage $V_{pre}$, the first transistor T1 may be turned on by applying $V_{DD}$ to the word line WL, and the ground voltage GND may be applied to the first data line DL1, the second data line DL2, and the rail RL. During this search, the input voltages of the resistive divider 111 are $V_{DL1}$=GND and $V_{DL2}$=GND. Thus, the voltage of the node G during a search based on the Y search criterion becomes GND, regardless of what value is stored in the bit cell 110. Because the voltage of the node G during a Y search is always GND and because GND is applied to the rail RL, the match-line transistor $T_2$ is kept off (indicating a match) regardless of the value stored in the bit cell 110.

As illustrated in FIG. 5B, during a searching operation it may be desirable to turn on the transistor $T_1$ while the ground voltage GND is applied to the data lines DL1/DL2 and before the search voltage $V_{search}$ is applied to either data line DL1/DL2. This is to avoid having $V_{search}$ temporarily appear on the node G before $V_G$ can stabilize to its appropriate value, thereby mistakenly turning on the match-line transistor $T_2$ temporarily and possibly discharging the match line ML. By turning on the transistor $T_1$ while GND is applied to both data lines DL1/DL2, it is ensured that GND is applied to the node G at the start of the search operation.

[CAMs—Detailed Examples]

Figure 6:
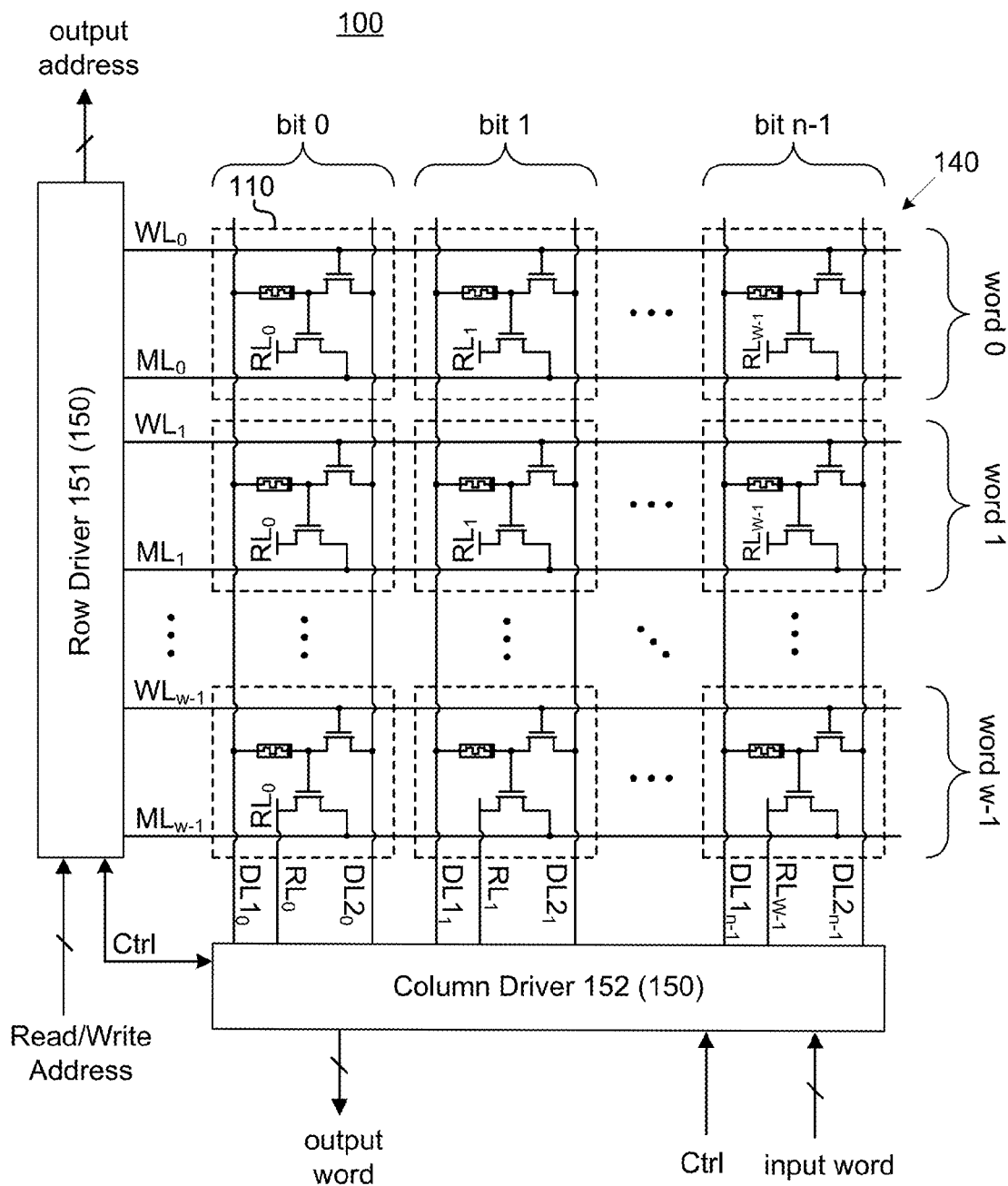
FIG. 6 is a diagram illustrating an example CAM with an array of multiple bit cells.

FIG. 6 illustrates an example CAM 100 that includes an array 140 of multiple bit cells 110. The bit cells 110 may be arrayed in W rows and N columns. In FIG. 6, each row corresponds to a word storage block (e.g., word 0 through word W−1), with each bit cell 110 in a given row corresponding to a bit position (e.g., bit 0 through bit N−1). The CAM 100 may include multiple word lines WL (e.g., $WL_0$ though $WL_{W-1}$), multiple match lines ML (e.g., $ML_0$ though $ML_{W-1}$), multiple first data lines DL1 (e.g., $DL1_0$ though $DL1_{N-1}$), multiple second data lines DL2 (e.g., $DL2_0$ though $DL2_{N-1}$), and multiple rails RL (e.g., $RL_0$ through $RL_{N-1}$). Each bit cell 110 in a given row may be connected to the same word line WL and to the same match line ML as one another. Thus, all of the bit cells 110 in a given word may be selected at the same time for writing/reading by turning on the word line WL that corresponds to the given word. In addition, during a search operation the match line ML of a given word may be pulled low if any one of the bit cells 110 that correspond to the word is a miss. Each bit cell 110 in a given column may be connected to the same first data line DL1, the same second data line DL2, and the same rail RL as one another. Thus, each bit cell 110 in a same column may be searched simultaneously based on the same search criterion.

The CAM 100 may include control circuitry 150 that applies signals to the various lines mentioned above so as to control operations of the bit cells, such as read, write, and search operations. The control circuitry 150 may comprise drivers, shift registers, decoders, and/or the like that are connected to the various wiring lines of the array 140. The control circuitry 150 may receive a control signal Ctrl that instructs the control circuitry 150 which operation it should perform. The control circuitry 150 may also receive a read/write address that indicates a target word storage block for a read operation or a write operation. The control circuitry 150 may output an output word as a result of performing a read operation, with the output word corresponding to the word that is stored in the word storage block whose address corresponds to the read/write address. The control circuitry 150 may also receive an input word that indicates either a word that the CAM 100 is to be searched for during a search operation or a word that is to be written to a particular word storage block during a write operation. The control circuitry 150 may also output an output address as a result of performing a search operation, with the output address corresponding to the address (or addresses) of any word storage block(s) whose stored word matches the input search word.

In FIG. 6, the control circuitry 150 is illustrated as including a row driver 151 and a column driver 152. The row driver 151 is connected to the word lines $WL_0$ though $WL_{W-1}$ and the match lines $ML_0$ though $ML_{W-1}$, and may supply electrical signals to and/or sense electrical signals carried on these wiring lines. The column driver 152 is connected to the first data lines $DL1_0$ though $DL1_{N-1}$, the second data lines $DL2_0$ though $DL2_{N-1}$, and the rails $RL_0$ through $RL_{N-1-1}$, and may supply electrical signals to and/or sense electrical signals carried on these wiring lines. It should be understood that this representation of the control circuitry 150 is merely for ease of description, and that it does not imply that the control circuitry 150 is necessarily composed of exactly two drivers in the configuration illustrated. For example, the control circuitry 150 could include a separate driver for each type of wiring line, a single driver for all the wiring lines, or any combination of drivers. As another example, the illustrated locations of the drivers relative to the array 140 are not intended to be meaningful, and it should be understood that drivers could be located on any side or combination of sides of the array 140.

The control circuitry 150 may control the CAM 100 to perform a read operation and a write operation in units of words. In particular, when the control signal Ctrl instructs the control circuitry 150 that a read operation or a write operation is to be performed, the row driver 151 may select the target word storage block based on the input read/write address by applying $V_{DD}$ to its corresponding word line WL, and the column driver 152 may then proceed to apply voltages to the column lines to perform the read/write operations for each bit cell 110 in the selected word storage block.

In particular, during a read operation, the column driver 152 may apply voltages to each of the first and second data lines DL1/DL2 and rails RL according to the table illustrated in FIG. 4. The current flowing through each of the N bit cells 110 of the target word storage block may be sensed by the column driver 152 (for example, via either the first or second data lines DL1/DL2). The column driver 152 may determine a bit value stored in each bit cell 110 based on the current that flows therethrough, and these N bit values may be combined into the output word that is output from the column driver 152.

During a write operation, the column driver 152 may determine, based on the input word, whether each of the N bit cells 110 in the target word storage block is to be set or reset and, in accordance with this determination, set or reset each of the N bit cells 110 in the target word storage block by applying the appropriate voltages to the corresponding first and second data lines DL1/DL2 and rail RL. In certain examples, setting and resetting operations may be performed simultaneously across the target word storage block. In certain other examples, setting and resetting operations may be performed in distinct phases. For example, all of the bit cells 110 in the target word storage block may first be reset, and then those bit cells 110 that are to be set may subsequently be set.

Although the reading and writing operations were described above as being performed in units of words, it should be understood that writing could be performed in other units. For example, any number of bit cells 110 could be written to or read from during a read or write operation without necessarily writing to or reading the other bit cells 110 in the same word storage block. In such an example, the word line WL of the word storage block that contains the target bit cell(s) 110 could be selected, the ground voltage GND could be applied to all of the first and second data lines DL1/DL2 that correspond to bit cells 110 that are not the target bit cell(s), and the voltages for the writing/reading operation could be applied to the first and second data lines DL1/DL2 of the target bit cell(s) 110. Thus, even though an entire word storage block is selected by its corresponding word line WL, any bit cells 110 that are not desired to be writing to or read from can be omitted from the writing/reading operation simply by applying GND to their corresponding data lines DL1/DL2.

The control circuitry 150 may control the CAM 100 to perform a search operation across the entire array 140 simultaneously. In particular, when the control signal Ctrl instructs the control circuitry 150 that a search operation is to be performed, the row driver 151 may select all of the target word storage blocks simultaneously by applying $V_{DD}$ to all of the word lines WL, and may pre-charge all of the match lines ML. The column driver 152 may then proceed to apply voltages to the column lines to perform the search operations for each bit position based on the input search word. In particular, the column driver 152 may determine, based on the input search word, which search criterion is to be used to search each bit position, and in accordance with this determination, apply the appropriate voltages to the corresponding first and second data lines DL1/DL2 and rail RL. The row driver 151 may then monitor the match lines to determine which are pulled low (indicating the corresponding word storage block stores a word that is a miss) and which remain charged (indicating the corresponding word storage block stores a word that is a match). The row driver 151 may decode the results of misses/matches from the match lines ML and output an address (or addresses) of a matching word storage block (or matching words storage blocks).

Figure 7:
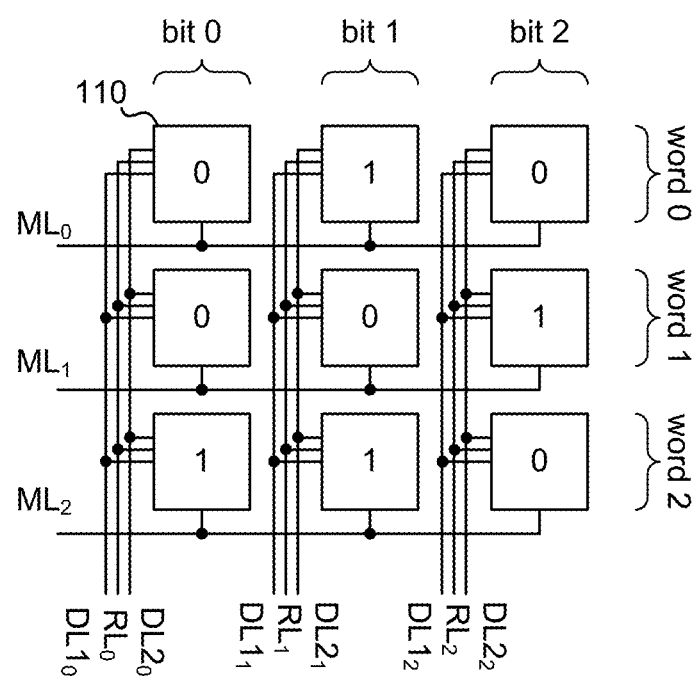
FIG. 7 is a diagram illustrating an example CAM with an array of bit cells storing particular values.

For example, consider the example CAM 100 illustrated in FIG. 7, which includes an array 140 having three rows and three columns of bit cells 110, with the bit cells 110 each storing values as indicated in the figure. Suppose that this example CAM 100 is searched with the input search word being "Y10". The column driver 152 will receive the input search word and the control signal Ctrl indicating a search operation, and based thereon would determine that the bit-0 column should be searched based on the wildcard search criterion (since the 0th bit of the search word is Y), the bit-1 column should be searched based on the 1 search criterion (since the 1st bit of the search word is 1), and the bit-2 column should be searched based on the 0 search criterion (since the 2nd bit of the search word is 0). Accordingly, the column driver 152 may perform the search operation by applying voltages to the various wiring lines as follows:

| | bit-0 column (Y search criterion) | | | bit-1 column (1 search criterion) | | | bit-2 column (0 search criterion) | | |
|---|---|---|---|---|---|---|---|---|---|
| Line: | $DL1_0$ | $DL2_0$ | $RL_0$ | $DL1_1$ | $DL2_1$ | $RL_1$ | $DL1_2$ | $DL2_2$ | $RL_2$ |
| Voltage: | GND | GND | GND | GND | $V_{search}$ | $V_1$ | $V_{search}$ | GND | $V_0$ |

Since the bit-0 column is searched on the basis of the wildcard criterion, none of the bit cells 110 in this column will be a miss, and hence none of these bit cells 110 will pull down their respective match lines ML. In particular, the voltage of the node G in each bit cell 110 in the bit-0 column will be GND because GND is applied to both $DL1_0$ and $DL2_0$. Because GND is also applied to $RL_0$, the gate-source voltage of the match-line transistor $T_2$ of each bit cell 110 in the bit-0 column will be zero, and hence the match-line transistor $T_2$ of each bit cell 110 in the bit-0 column will remain off.

The [bit-1, word-0] bit cell 110 stores a 1 and is searched on the basis of the 1 search criterion, and hence from equation 8 the voltage of node G becomes $$\frac{R_{LRS}}{R_{LRS} + R_{T1}} V_{search},$$

which is a low value. Thus, the match-line transistor $T_2$ remains off and the [bit-1, word-0] bit cell 110 does not pull down its match line $ML_0$.

The [bit-2, word-0] bit cell 110 stores a 0, and is searched on the basis of the 0 search criterion, and hence from equation 5 the voltage of node G becomes $$\frac{R_{T1}}{R_{HRS} + R_{T1}} V_{search},$$

which is a low value. Thus, the match-line transistor $T_2$ remains off and the [bit-2, word-0] bit cell 110 does not pull down its match line $ML_0$.

Because none of the bit cells 110 in the word 0 pull down the match line $ML_0$, the row driver 151 determines that the word 0 is a match for the search word. Thus, an address of the word 0 is output from the row driver 151 as an output address.

The [bit-1, word-1] bit cell 110 stores a 0 and is searched on the basis of the 1 search criterion, and hence from equation 6 the voltage of node G becomes $$\frac{R_{HRS}}{R_{HRS} + R_{T1}} V_{search}$$

which is a high value. Thus, the match-line transistor $T_2$ is turned on and the [bit-1, word-1] bit cell 110 pulls down its match line $ML_1$.

The [bit-2, word-1] bit cell 110 stores a 1 and is searched on the basis of the 0 search criterion, and hence from equation 7 the voltage of the node G becomes $$\frac{R_{T1}}{R_{LRS} + R_{T1}} V_{search},$$

which is a high value. Thus, the match-line transistor $T_2$ is turned on and the [bit-2, word-1] bit cell 110 pulls down its match line $ML_1$.

Because the [bit-1, word-1] and [bit-2, word-1] bit cells 110 pull down the match line $ML_1$, the row driver 151 determines that the word 1 is a miss for the search word. Thus, an address of the word 1 is not output from the row driver 151 as an output address.

The states of the [bit-1, word-2] and [bit-2, word-2] are similar to the states of the [bit-1, word-0] and [bit-2, word-0] bit cells 110 that were described above, and hence they will not be described in detail. In short, since the [bit-1, word-2] and [bit-2, word-2] bit cells 110 are matches, neither one pulls down the match line $ML_2$, and therefore the row driver 151 determines that the word 2 is a match for the search word. Thus, an address of the word 2 is output from the row driver 151 as an output address.

[Example Devices with CAMs]

The example CAMs described herein may be used in any electronic device in which a memory might be useful, such as, for example, in a personal computer, server, smartphone, tablet, network device, etc. In particular, the example CAMs can be used to store data for the device by writing the data into the CAM, and the device can access the stored data by reading from the CAM. Moreover, the example CAMs may also allow the device to search the CAM based on an input search word, which can be particularly useful in a variety of applications. For example, a database application executed by an example device may benefit greatly by the device using the example CAMs. As another example, a network device (such as a router, switch, gateway, etc.) may greatly benefit from using the example CAMs, as the high search speed provided by the CAM may allow the network device to operate at higher speeds than may otherwise be possible.

Figure 8:
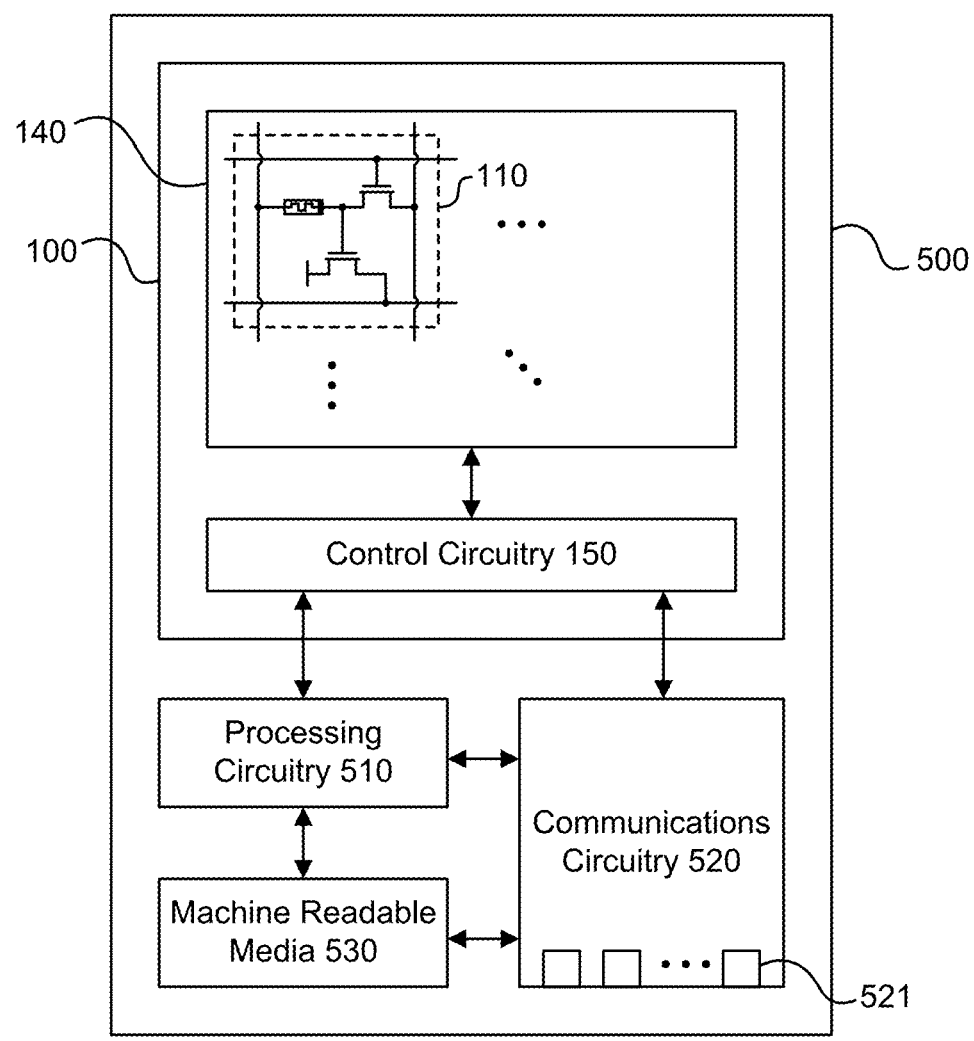
FIG. 8 is a diagram illustrating an example device that includes an example CAM as a component thereof.

FIG. 8 illustrates an example device 500 that includes an example CAM 100. For ease of explanation, certain aspects of the example device 500 will be described below with the assumption that the example device 500 operates as a network device, but it should be understood that the example device 500 could be any type of electronic device. Moreover, some of the features described below could be omitted from the example device 500 and others not described below could be added.

The device 500 may include a CAM 100, a processing circuitry 510, communications circuitry 520, and machine readable media 530. The CAM 100 may be an instance of the example CAM 100 described above, and may include an array 140 of bit cells 110 and control circuitry 150.

The processing circuitry 510 may supply the control signal Ctrl to the control circuitry 150. The processing circuitry 510 may also supply the input word and the read/write address to the control circuitry 150. The processing circuitry 510 may be any circuitry capable of executing machine-readable instructions, such as a central processing unit (CPU), a microprocessor, a microcontroller device, a digital signal processor (DSP), etc. The processing circuitry 510 may also be an application-specific integrated circuit (ASIC), a field-programmable gate array (FPGA), an application-specific instruction set processor (ASIP), or the like, that is configured to perform certain operations described herein, such as the read, write, and search operations.

The machine readable media 530 may be any non-transitory machine readable medium, which may include volatile storage media (e.g., DRAM, SRAM, etc.) and/or non-volatile storage media (e.g., PROM, EPROM, EEPROM, NVRAM, hard drives, optical disks, etc.). The machine readable media 530 may store machine-readable instructions that, when executed by the processing circuitry 510, cause the device 500 to perform some or all of the operations described herein, such as the read, write, and search operations.

The communications circuitry 520 may be circuitry for receiving input data communications and sending output data communications. For example, the communications circuitry 520 may include a network interface card. In certain examples, the communications circuitry 520 may include multiple communications ports 521, and may serve to connect multiple other electronic devices to one another via the device 500. For example, the device 500 may be a network router, network switch, network gateway, or the like, and may perform various traffic control tasks such as routing, switching, etc. In certain examples, the communications circuitry 520 may receive communications that include a destination address (such as an IP address), and the communications circuitry 520 may determine which communications port 521 to forward the received communication to based on the destination address.

In particular, the communications circuitry 520 may determine which port 521 to forward a received communication to by searching the CAM 100 based on the destination address that was included in the communication. For example, each device that is connected to the device 500 may have a unique device address (such as an IP address), and the device 500 may store the device address of each device that is connected thereto in the CAM 100 such that the location of the stored device address within the CAM 100 corresponds to the communications port 521 to which the device is connected. In particular, each word storage block of the CAM 100 may correspond to a different port 521 of the device 500, and whenever a new device is connected to the device 500 the device address of the new device may be written into a word storage block that corresponds to the port 521 to which the new device is connected. Subsequently, when a communication is received by the communication circuitry 520, the destination address of the communication may be sent to the CAM 100 (either directly, or via the processing circuitry 510) as an input search word; the CAM 100 may then return a memory address of a matching word storage block to the communications circuitry 520 (either directly or via the processing circuitry 510). Because each word storage block in this example corresponds to a particular port 521, the memory address of the word storage block may be understood by the communications circuitry 520 to identity a particular port 521, and therefore the communications circuitry 520 can determine which port 521 to forward the communication to based on the output address of the CAM 100. In certain examples, the memory address of each word storage block may be the same as the address of one of the ports 521, which may enable the communications circuitry 520 to easily determine from an output memory address which port 521 corresponds thereto.

In such an example, the CAM 100 may operate as sort of look-up table that indicates which port corresponds to which destination address. However, because the entire array 140 of the CAM 100 may be searched simultaneously and may be searched at the hardware level, the amount of time it takes for the device 500 to determine which port to forward a communication to can be greatly reduced.

In certain examples described above, the example memristor M is a bipolar memristor—i.e., it is set by a voltage difference/current having one polarity and reset by a voltage difference/current having a different polarity. However, in other examples the memristor M may be a unipolar memristor—i.e., a memristor that is set and reset by the same polarity. In examples that use unipolar memristors, the same reading and searching operations that were described above with regard to a bipolar memristor could be used, and any known unipolar memristor writing method could be used in place of the writing method described above.

In the description above, the memory element of the bit cell 110 is described as a memristor. In the art, the term "memristor" may be used in certain contexts in a broad sense and may be used in certain contexts in a narrow sense. In one narrow sense, "memristor" may refer specifically to circuit elements that exhibit a non-linear relationship between electric charge and magnetic flux (or exhibit a relationship between the time integral of current and the time integral of voltage). In the broad sense, "memristor" refers broadly to any non-volatile memory element that is based on changing resistance states and is read by its resistance. Herein and in the appended claims, "memristor" is always used in the broad sense, unless specifically indicated otherwise; specifically, as used herein, "memristor" refers broadly to any non-volatile memory element that is based on changing resistance states and is read by its resistance. Thus, as used herein the memristor M may be, for example, a memristor in the narrow sense of the term, a memory element that changes the resistance across a dielectric solid-state material, a phase-change memory element (sometimes referred to as PCM or PCRAM), a conductive-bridging memory element (sometimes referred to as CBRAM or a programmable metallization cell), a magnetoresistive memory element (sometimes referred to as MRAM), or the like.

The example CAMs are described herein and illustrated in the drawings in a conceptual or schematic manner to aid understanding. In particular, physical structures in the example CAMs are referred to and/or illustrated conceptually herein as circuit components, and the relationships between these circuit components are illustrated in circuit diagrams in accordance with the usual practice in the art. Circuit components are conceptual representations of classes of physical structures or devices that perform certain functions and/or have certain properties. Examples of such circuit components include passive devices such as resistors, capacitors, memristors, etc.; active devices such as transistors, diodes, etc.; constituent elements of the active/passive devices such as terminals, electrodes, gates, sources, drains, etc.; elements that connect devices such as wiring lines, nodes, etc.; and so on. It should be understood that a single physical structure (or set of physical structures) in an actual physical incarnation of an example CAM may serve multiple functions and/or have multiple properties, and thus a single physical structure (or set of physical structures) may be described and/or illustrated herein as multiple distinct circuit components. For example, a single piece of metal in a particular physical incarnation of an example CAM may serve as both a gate electrode of a transistor and as a wiring line. Thus, the fact that two or more circuit components may be referred to or illustrated herein as distinct components should not be interpreted to mean that their corresponding physical structures in a physical incarnation of the example CAM are distinct structures.

When reference is made herein or in the appended claims to a first circuit component being "connected to" a second circuit component, this means that: (1) the physical structures corresponding to the first and second components are so arranged that a current path exists therebetween, and/or (2) a single physical structure serves as at least a part of both the first and second circuit components. Note that, in light of this definition, a reference herein to or illustration in the drawings of multiple circuit components being "connected to" one another does not imply that the circuit components are necessarily separate physical entities. For example, a reference to a first circuit component being "connected to" a second circuit component could encompass: (A) a scenario in which a physical structure that serves as a terminal of the first circuit component is in direct physical contact with a physical structure that serves as a terminal of the second circuit; (B) a scenario in which a physical structure that serves as a terminal of the first circuit component is in direct physical contact with an electrical conductor (e.g., a wiring line) that is itself in direct physical contact with a physical structure that serves as a terminal of the second circuit; (C) a scenario in which the same physical structure that serves as a terminal of the first circuit component also serves as a terminal of the second circuit component; etc.

When reference is made herein or in the appended claims to a first component being "connected between" second and third component, this means that two opposing terminals of the first component are connected to the second component and to the third component, respectively. In particular, when reference is made herein or in the appended claims to a transistor being "connected between" two elements, this means that a source terminal of the transistor (also referred to as a source electrode, source region, source, etc.) is connected to one of the two elements, and a drain terminal of the transistor (also referred to as a drain electrode, drain region, drain, etc.) is connected to the other one of the two elements.

When reference is made herein or in the appended claims to a number of circuit components being "connected in series between" a first element and a second element, this means that the number of circuit components are connected end-to-end in a series, in the same order that they are recited, and that the first circuit component of the series is connected to the first element and the last circuit component of the series is connected to the second element. For example, "A, B, and C are connected in series between D and E" means that D is connected to A, A is connected to B, B is connected to C, and C is connected to E, which may be graphically represented as D-{A-B-C}-E where the dashes ("-") indicate connections and the braces ("{ }") indicate the series.

As used herein, applying a given voltage difference "across" a circuit component (such as the memristor M) means applying voltages to two terminals of the circuit component such that the larger of the applied voltages minus the smaller of the applied voltages equals the given voltage difference. A polarity with which the voltage difference is applied across the circuit component corresponds to the direction in which current would tend to flow through the circuit component (if allowed to do so) as a result of the applied voltage difference, which will depend upon which terminal of the circuit component has the larger of the applied voltages. In particular, when the given voltage difference is applied across the circuit component by applying the larger of the applied voltages to a first terminal of the circuit component and the smaller of the applied voltages to a second terminal of the circuit component, this may be referred to as applying the given voltage difference with a first polarity; when the given voltage difference is applied across the circuit component by applying the larger of the applied voltages to the second terminal and the smaller of the applied voltages to a first terminal, this may be referred to as applying the given voltage difference with a second polarity.

References herein to a resistance $R_{LRS}$ that is associated with a low resistance state of the memristor M should not be interpreted to imply that each memristor M is set precisely to the value $R_{LRS}$ each time they are set to the low resistance state. In certain examples, the low resistance state of the memristor M might encompass a range of resistance values rather than just one specific resistance value. In particular, the resistance of the memristor M is not necessarily the exact same value each time that the memristor M is set to the low resistance state. This may occur, for example, as a result of inevitable manufacturing variances between memristors M as well as inventible variances in the voltages that are applied for setting/resetting operations. Instead, the resistance $R_{LRS}$ is a particular resistance value that is associated with the range of resistance values that comprises the low resistance state of the memristor M.

Similarly, references herein to a resistance $R_{HRS}$ that is associated with a high resistance state of the memristor M should not be interpreted to imply that each memristor M is set precisely to the value $R_{HRS}$ each time they are reset to the high resistance state. In certain examples, the high resistance state of the memristor M might encompass a range of resistance values rather than just one specific resistance value. In particular, the resistance of the memristor M is not necessarily the exact same value each time that the memristor M is reset to the high resistance state. Instead, the resistance $R_{HRS}$ is a particular resistance value that is associated with the range of resistance values that comprises the high resistance state of the memristor M.

The resistances $R_{LRS}$ and $R_{HRS}$ may be determined by a variety of methods. For example, a range of resistance values for the low resistance state and a range of resistance values for the high resistance state may be determined by repeatedly setting and resetting the memristor M and measuring its resistance each time and determining the ranges of values based on these measurements, and then the resistances $R_{LRS}$ and $R_{HRS}$ may be determined to be particular values within their corresponding ranges. For example, the resistance $R_{LRS}$ may be the highest value of the range of low resistance state values and the resistance $R_{HRS}$ may be the lowest value of the range of high resistance state values. In certain examples, the resistances $R_{LRS}$ and $R_{HRS}$ may be determined to be statistical aggregations of measured resistance values of the memristor M (or of multiple memristors M) in the set and reset states, respectively; for example, $R_{LRS}$ and $R_{HRS}$ may be determined to be the average, the median, the mode, etc., of their respectively corresponding measured resistance values. In certain examples, the memristor(s) M may be repeatedly set and reset and their resistances measured, and $R_{LRS}$ and $R_{HRS}$ may be determined to be the lowest and the highest resistance values, respectively, that are measured in this process.

In the description above, the transistors of the bit cell were described as all being NFET transistors, but it should be understood that all PFET transistors could be used instead. In such a case, the voltages that result in the transistors turning on and off would be reversed (low gate-source voltage turning the PFET on and high gate-source voltage turning the PFET off), and therefore voltages applied during the search operations may be reversed to preserve the desired search results.

Throughout this disclosure and in the appended claims, occasionally reference may be made to "a number" of items. Such references to "a number" mean any integer greater than or equal to one. When "a number" is used in this way, the word describing the item(s) may be written with the pluralized "s" for grammatical consistency, but this does not necessarily mean that multiple items are being referred to. Thus, for example, "a number of comparators" could encompass both one comparator and multiple comparators.

While the above disclosure has been shown and described with reference to the foregoing examples, it should be understood that other forms, details, and implementations may be made without departing from the spirit and scope of this disclosure.

What is claimed is:

1. A content addressable memory comprising:
   a bit cell comprising:
      a memristor and a switching transistor that are connected in series between a first data line and a second data line; and
      a match-line transistor connected between a match line and a rail,
   wherein a gate of the match-line transistor is connected to a common node of the memristor and the switching transistor, and
   the switching transistor is sized such that its channel resistance when on is between a resistance associated with a low-resistance state of the memristor and a resistance associated with a high-resistance state of the memristor.

2. The content addressable memory of claim 1, further comprising:
   control circuitry that is to search the bit cell based on a first search criterion, search the bit cell based on a second search criterion, and search the bit cell based on a wildcard search criterion.

3. The content addressable memory of claim 1, further comprising:
control circuitry that is to:
search the bit cell based on a first search criterion by pre-charging the match line, applying a first voltage to the first data line, applying a ground voltage to the second data line, and applying a third voltage to the rail; and
search the bit cell based on a second search criterion by pre-charging the match line, applying the ground voltage to the first data line, applying the first voltage to the second data line, and applying a fourth voltage to the rail.

4. The content addressable memory of claim 3, wherein the third voltage is set such that, when the bit cell is searched based on the first search criterion:
the match-line transistor is off when the value stored in the bit cell is a match, and
the match-line transistor is on when the value stored in the bit cell is a miss.

5. The content addressable memory of claim 4, wherein the third voltage is set so as to be greater than a value resulting from multiplying the first voltage by $$\frac{R_T}{R_H + R_T}$$

and subtracting a threshold voltage of the match line transistor, where $R_H$ is a resistance associated with a high resistance state of the memristor, and $R_T$ is a channel resistance of the switching transistor when on.

6. The content addressable memory of claim 5, wherein the third voltage is set so as to be less than a value resulting from multiplying the first voltage by $$\frac{R_T}{R_T + R_L}$$

and subtracting the threshold voltage of the match line transistor, where $R_L$ is a resistance associated with a low resistance state of the memristor.

7. The content addressable memory of claim 3, wherein the fourth voltage is set such that, when the bit cell is searched based on the second search criterion:
the match-line transistor is off when the value stored in the bit cell is a match, and
the match-line transistor is on when the value stored in the bit cell is a miss.

8. The content addressable memory of claim 7, wherein the fourth voltage is set so as to be greater than a value resulting from multiplying the first voltage by $$\frac{R_L}{R_L + R_T}$$

and subtracting a threshold voltage of the match line transistor, where $R_L$ is a resistance associated with a low resistance state of the memristor, and $R_T$ is a channel resistance of the switching transistor when on.

9. The content addressable memory of claim 8, wherein the fourth voltage is set so as to be less than a value resulting from multiplying the first voltage by $$\frac{R_H}{R_T + R_H}$$

and subtracting the threshold voltage of the match line transistor, where $R_H$ is a resistance associated with a high resistance state of the memristor.

10. The content addressable memory of claim 3, wherein the control circuitry is to search the bit cell based on a wildcard search criterion by applying the ground voltage to the first data line, the second data line, and the rail.

11. A content addressable memory comprising:
a plurality of bit cells arrayed in rows and columns;
a plurality of match lines, each corresponding to N bit cells that are in the same row as one another, where N is a word size of the content addressable memory;
a plurality of first data lines, each corresponding to one of the columns of bit cells;
a plurality of second data lines, each corresponding to one of the columns of bit cells;
a plurality of rails, each corresponding to one of the columns of bit cells;
wherein each of the plurality of bit cells includes:
a memristor and a switching transistor that are connected in series between the corresponding one of the plurality of first data lines and the corresponding one of the plurality of second data lines, where the switching transistor is to control whether the bit cell is selected for a writing operation and whether the bit cell is selected for a reading; and
a match-line transistor connected between the corresponding one of the plurality of match lines and the corresponding one of the plurality of rails, a gate of the match-line transistor being connected to a common node of the memristor and switching transistor.

12. The content addressable memory of claim 11, further comprising control circuitry that is to write data to the plurality of bit cells, read data stored in the plurality of bit cells, and search for a word stored in the plurality of bit cells by applying voltages to the plurality of match lines, the plurality of first data lines, the plurality of second data lines, and the plurality of rails,
wherein the control circuitry is to search for a word stored in the plurality of bit cells on the basis of a first search criterion, on the basis of a second criterion, and on the basis of a wildcard criterion.

13. The content addressable memory of claim 12, wherein the control circuitry is to, in searching for a word stored in the plurality of bit cells, search all of the plurality of bit cells simultaneously.

14. The content addressable memory of claim 11, wherein, for each of the plurality of bit cells, the switching transistor is sized such that its channel resistance when on is between a resistance associated with a low-resistance state of the memristor and a resistance associated with a high-resistance state of the memristor.

15. The content addressable memory of claim 11, further comprising:
control circuitry that is to write data to the plurality of bit cells, read stored data from the plurality of bit cells, and search for a word stored in the plurality of bit cells,
wherein the control circuitry is to, in searching for a word stored in the plurality of bit cells, search a given column of bit cells out of the plurality of columns based on a first search criterion by: pre-charging each of the match lines corresponding to the given column of bit cells, applying a first voltage to the corresponding one of the first data lines, applying a ground voltage to the corresponding one of the second data lines, and applying a third voltage to the corresponding one of the rails; and the control circuitry is to, in searching for a word stored in the plurality of bit cells, search a second given column of bit cells out of the plurality of columns based on a second search criterion by: pre-charging each of the match lines corresponding to the second given column of bit cells, applying the ground voltage to the corresponding one of the first data lines, applying the first voltage to the corresponding one of the second data lines, and applying a fourth voltage to the corresponding one of the rails.

16. An electronic device, comprising:

a content addressable memory (CAM) that comprises a plurality of bit cells that each includes a resistive divider whose output voltage controls a match-line transistor, the resistive divider comprising a memristor and a switching transistor connected in series between first and second data lines, wherein the CAM is to search a given bit cell of the plurality of bit cells based on a first search criterion by applying a first voltage difference across the resistive divider with a first polarity, the CAM is to search the given bit cell based on a second search criterion by applying the first voltage difference across the resistive divider with a second polarity, and for each of the plurality of bit cells, the switching transistor is sized such that its channel resistance when on is between a resistance associated with a low resistance state of the memristor and a resistance associated with a high resistance state of the memristor.

17. The electronic device of claim 16, wherein the CAM is to search the given bit cell based on a wildcard criterion by applying a ground voltage to both input terminals of the resistive divider.

18. The content addressable memory of claim 11, further comprising:

a plurality of word lines, each corresponding to N bit cells that are in the same row as one another, wherein each of the switching transistors has a gate electrode connected to a corresponding one of the plurality of word lines; and control circuitry that is to select a group of N bit cells for a writing operation by applying a control signal to one of the plurality of word lines corresponding to the group of N bit cells.

* * * * *